US012578358B2

(12) United States Patent
Kita et al.

(10) Patent No.: US 12,578,358 B2
(45) Date of Patent: Mar. 17, 2026

(54) SOCKET BOARD WITH A SOCKET HAVING HEAT CONDUCTIVE MATERIAL DISPOSED ON BOTTOM PORTION OF THE SOCKET AND METHOD FOR INSPECTING A SEMICONDUCTOR DEVICE MOUNTING IN THE SOCKET

(71) Applicant: Kioxia Corporation, Tokyo (JP)

(72) Inventors: Tsunehiro Kita, Fujisawa Kanagawa (JP); Soichiro Ibaraki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 192 days.

(21) Appl. No.: 18/460,495

(22) Filed: Sep. 1, 2023

(65) Prior Publication Data

US 2024/0094244 A1     Mar. 21, 2024

(30) Foreign Application Priority Data

Sep. 21, 2022     (JP) ................................. 2022-150321

(51) Int. Cl.
*G01R 31/26*     (2020.01)
*G01R 1/04*     (2006.01)
*G01R 31/28*     (2006.01)

(52) U.S. Cl.
CPC ......... *G01R 1/0466* (2013.01); *G01R 1/0483* (2013.01); *G01R 31/2875* (2013.01)

(58) Field of Classification Search
CPC .. G01R 1/0458; G01R 1/0466; G01R 1/0483; G01R 31/2875; G01R 31/2863; G01R 31/2886; G01R 1/0408; G01R 31/26;

G01R 1/0433; G01R 31/2874; G01R 1/07378; G01R 31/2896; G01R 1/07314; G01R 1/0416; G01R 1/0441; G01R 31/2851; G01R 1/06711; G01R 1/07307; G01R 31/2889; G01R 31/2865; G01R 1/06794; G01R 31/2808; G01R 31/2849;

(Continued)

(56) References Cited

U.S. PATENT DOCUMENTS 5,006,792 A * 4/1991 Malhi ................ G01R 1/06727
257/691
5,225,037 A * 7/1993 Elder ................... G01R 1/0735
216/102

(Continued)

FOREIGN PATENT DOCUMENTS

JP     H10-003973 A     1/1998
JP     2020-118475 A     8/2020

*Primary Examiner* — Vinh P Nguyen
(74) *Attorney, Agent, or Firm* — Kim & Stewart LLP

(57)     ABSTRACT

A socket board used for testing a semiconductor device having one or more terminals, by raising a temperature of the semiconductor device to a predetermined temperature, includes a substrate, a socket that is provided on the substrate and capable of holding the semiconductor device, a pin that penetrates a bottom portion of the socket, and has an upper portion that is to come into contact with a terminal of the semiconductor device, and a heat conductive material that is disposed on the bottom portion of the socket to come into contact with the terminals of the semiconductor device held in the socket. The heat conductive material includes a macromolecular gel, and electrically-insulating metal-containing particles added to the macromolecular gel.

14 Claims, 9 Drawing Sheets

(58) Field of Classification Search
CPC .. H01R 12/714; H01R 12/7047; H01R 13/24;
H01R 2201/20; H01R 33/76; H01R
13/11; H01R 33/97; H01R 13/10; H01R
24/76; H05K 3/301
See application file for complete search history.

(56) References Cited

U.S. PATENT DOCUMENTS

| | | | | |
|---|---|---|---|---|
| 5,800,184 A * | 9/1998 | Lopergolo | ........... | H05K 7/1069 |
| | | | | 439/862 |
| 6,046,597 A * | 4/2000 | Barabi | ................ | H05K 7/1061 |
| | | | | 324/762.02 |
| 6,072,322 A * | 6/2000 | Viswanath | ......... | G01R 31/2863 |
| | | | | 324/750.1 |
| 6,369,595 B1 * | 4/2002 | Farnworth | ............. | H05K 1/112 |
| | | | | 324/762.02 |
| 6,819,127 B1 * | 11/2004 | Hembree | ............. | G01R 1/0483 |
| | | | | 324/754.13 |
| 7,259,580 B2 | 8/2007 | Aube | | |
| 7,276,924 B2 * | 10/2007 | Maruyama | ......... | G01R 31/2875 |
| | | | | 324/762.01 |
| 8,272,882 B2 * | 9/2012 | Sakai | ................... | G01R 1/0483 |
| | | | | 439/268 |
| 8,603,840 B2 * | 12/2013 | Matsuhashi | .......... | G01R 1/0466 |
| | | | | 324/750.19 |
| 9,335,367 B2 | 5/2016 | Hebig | | |
| 11,650,246 B1 * | 5/2023 | Leong | ............... | G01R 1/07314 |
| | | | | 324/750.05 |
| 11,668,744 B2 * | 6/2023 | Hwang | .............. | G01R 31/2863 |
| | | | | 324/750.05 |
| 2020/0233027 A1 | 7/2020 | Takamoto | | |

* cited by examiner

*FIG. 1*

START

S1
ASSEMBLY OF SEMICONDUCTOR DEVICE

S2
TEST OF ELECTRICAL CHARACTERISTICS

BURN-IN TEST

S3
SHIPPING INSPECTION

S4
PACKING AND INSPECTION

S5
PRODUCT SHIPPING

END

SOCKET BOARD WITH A SOCKET HAVING HEAT CONDUCTIVE MATERIAL DISPOSED ON BOTTOM PORTION OF THE SOCKET AND METHOD FOR INSPECTING A SEMICONDUCTOR DEVICE MOUNTING IN THE SOCKET

CROSS-REFERENCE TO RELATED APPLICATION(S)

This application is based upon and claims the benefit of priority from Japanese Patent Application No. 2022-150321, filed Sep. 21, 2022, the entire contents of which are incorporated herein by reference.

FIELD

Embodiments described herein relate generally to a socket board and a method for inspecting a semiconductor device.

BACKGROUND

In order to inspect the quality of a semiconductor device, a semiconductor device mounted on a socket is subjected to a test while it operates under a high-temperature environment. In such a test, heat generated by the semiconductor device may cause the temperature inside the socket to rise above a set temperature for the test. In such a case, the semiconductor device may be exposed to a temperature excessively higher than the set temperature, and accurate results may not be obtained.

DESCRIPTION OF THE DRAWINGS

FIG. 1 is a sectional view showing an example of a configuration of a semiconductor device.

DETAILED DESCRIPTION

Figure 2A:
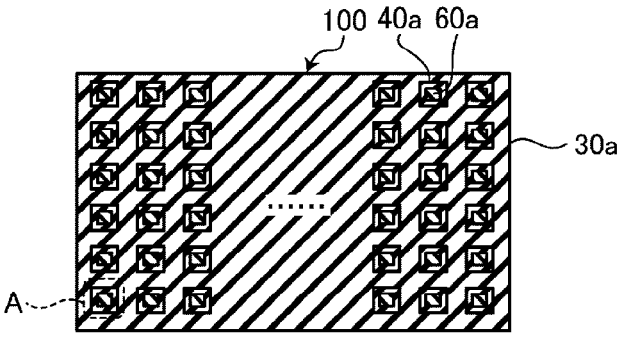
FIGS. 2A to 2C are views showing an example of a configuration of a socket board according to a first embodiment.

Embodiments provide a socket board and a method for inspecting a semiconductor device.

In general, according to one embodiment, the socket board is a socket board used for testing a semiconductor device having one or more terminals, by raising a temperature of the semiconductor device to a predetermined temperature, includes a substrate, a socket that is provided on the substrate and capable of holding a surface of the semiconductor device, a pin that penetrates a bottom portion of the socket and has an upper portion that is to come into contact with a terminal of the semiconductor device, and a heat conductive material that is disposed on the bottom portion of the socket to come into contact with the terminals of the semiconductor device held in the socket. The heat conductive material includes a macromolecular gel, and electrically-insulating metal-containing particles added to the macromolecular gel.

Hereinafter, embodiments will be described in detail with reference to the drawings. The present disclosure is not limited to the following embodiments. Configuration elements in the following embodiments include those that can be understood by those skilled in the art or those that are substantially the same.

Embodiment 1

Hereinafter, Embodiment 1 of the present disclosure will be described in detail with reference to FIGS. 1 to 9.

Structure Example of Semiconductor Device

Figure 1:
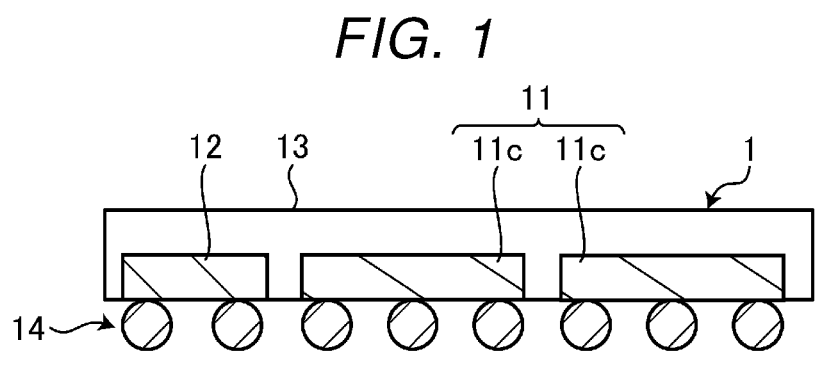

FIG. 1 is a sectional view showing a configuration example of a semiconductor device 1. As shown in FIG. 1, a semiconductor device 1 is a semiconductor package in which a semiconductor chip is sealed. Specifically, for example, the semiconductor device 1 includes a nonvolatile memory 11, a controller 12 that controls the nonvolatile memory 11, a sealing member 13, and terminals 14.

The nonvolatile memory 11 stores data in a nonvolatile manner. The nonvolatile memory 11 includes, for example, a plurality of memory chips 11c. The nonvolatile memory 11 is, for example, any one of various storage media such as NAND flash memory, NOR flash memory, resistance random access memory (ReRAM), and ferroelectric random access memory (FeRAM).

The controller 12 is a semiconductor integrated circuit configured as, for example, a system-on-a-chip (SoC). The controller 12 is configured as a field-programmable gate array (FPGA) or an application specific integrated circuit (ASIC). The controller 12 controls an operation of the nonvolatile memory 11 according to a request from external equipment such as a host computer. For example, the controller 12 controls reading of data from and writing of data to the nonvolatile memory 11.

The sealing member 13 is, for example, a thermosetting resin such as epoxy resin or acrylic resin, and seals the nonvolatile memory 11 and the controller 12. The terminals 14 are, for example, ball grids or the like formed in an array, and are provided on the lower surface of the semiconductor device 1.

Demands for miniaturization and thinning of the semiconductor device 1 are achieved by a multi-chip package (MCP) method in which a plurality of semiconductor chips are mounted in one package which is described above, or the like.

On the other hand, according to such an MCP method, for example, due to high integration density, it is difficult to dissipate heat generated during the operation of each semiconductor chip, and a temperature inside the package may rise. A malfunction of the semiconductor device 1 may occur due to such a temperature rise. Therefore, the semiconductor device 1 is required to have a quality that allows it to operate normally even in a high-temperature environment.

In order to meet the above requirement, the semiconductor device 1 is mounted on a socket board, the temperature is raised to a predetermined temperature, and an operation test is performed to evaluate the quality of the semiconductor device 1 in the high-temperature environment before shipment.

A socket board 100 used for such a test will be described with reference to FIGS. 2A to 2C to FIG. 9.

Configuration Example of Socket Board

Figure 2B:
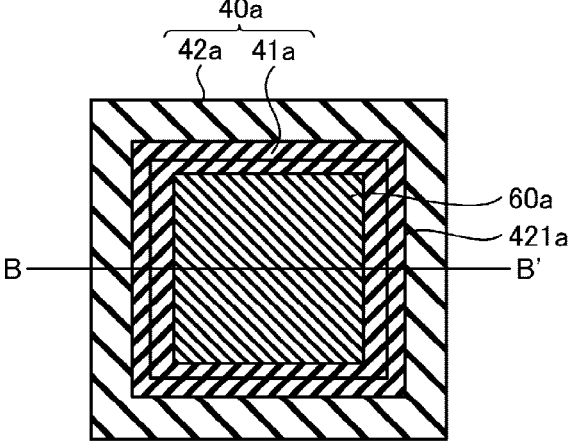
Figure 2C:
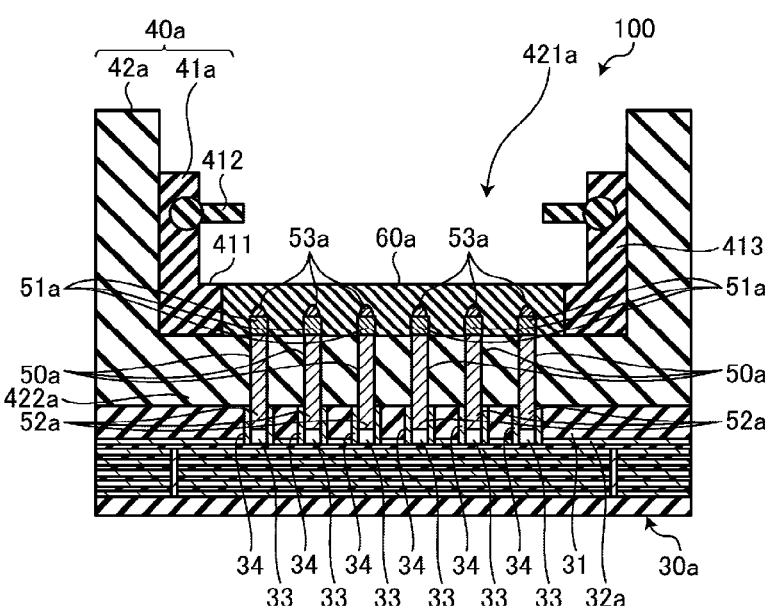

FIGS. 2A to 2C are views showing an example of a configuration of the socket board 100 according to Embodiment 1. FIG. 2A is a top view of the socket board 100. FIG. 2B is an enlarged top view of the socket board 100 in an area A of FIG. 2A. FIG. 2C is an enlarged sectional view of the socket board 100 taken along line B-B' of FIG. 2B.

The socket board 100 includes a board 30a, a socket 40a, and a heat conductive material 60a. The socket board 100 has a configuration in which the socket 40a on which the semiconductor device 1 can be mounted is disposed on an upper surface of the board 30a. As shown in FIG. 2A, the sockets 40a may be disposed in a matrix on the upper surface of the board 30a, and for example, about 200 sockets 40a may be disposed. The heat conductive material 60a is disposed inside each socket 40a.

As shown in FIGS. 2B and 2C, the board 30a, more generally referred to as a substrate, is a printed circuit board (PCB) or the like in which insulating layers 31 and conductive layers 32a are alternately stacked multiple times. The insulating layer 31 is made of carbon fiber, glass fiber, aramid fiber, or the like which is impregnated with thermosetting resin such as epoxy resin before curing. The conductive layer 32a is made of, for example, a metal such as Cu, and has wiring patterns extending in a planar direction of the board 30a, vias connecting the wiring patterns perpendicularly to the planar direction, and the like. Electric power is supplied from a testing device (not shown) to the semiconductor device 1 mounted on the socket board 100 via the conductive layer 32a and via the socket 40a.

The board 30a has through-holes 33 into which terminals 50a of the socket 40a, which will be described later, are inserted. The through-hole 33 extends to a predetermined depth in the insulating layer 31 and reaches a predetermined conductive layer 32a. A metal layer 34 such as Cu plating is formed on a side wall of the through-hole 33. The metal layer 34 is in contact with the conductive layer 32a.

The socket 40a includes a clamping portion 41a, a socket guide 42a, and terminals 50a. The socket guide 42a is a member made of resin or the like, and has, for example, a shape similar to that of the described-above semiconductor device 1, such as a rectangle when viewed from above. The socket guide 42a is disposed on the upper surface of the board 30a. A recessed portion 421a is formed on an upper surface of the socket guide 42a.

The clamping portion 41a capable of supporting the semiconductor device 1 is formed inside the recessed portion 421a of the socket guide 42a. The clamping portion 41a is a support member capable of clamping the semiconductor device 1 in a state where the surface of the semiconductor device 1 having the terminals 14 faces downward. The clamping portion 41a is made of, for example, resin or the like.

The clamping portion 41a has a side wall portion 413 provided along an inner wall of the recessed portion 421a, a step 411 toward the bottom surface of the recessed portion 421a, and a latch 412 provided on the side wall portion 413 and extending above the step 411. By placing the semiconductor device 1 on the step 411 and pressing the semiconductor device 1 from above with the latch 412, the semiconductor device 1 is mounted on the socket 40a. Further, by releasing the latch 412, the semiconductor device 1 can be removed from the socket 40a.

When the semiconductor device 1 is tested, the semiconductor device 1 is inserted into the clamping portion 41a by a picker or the like (not shown), and after the test is completed, the semiconductor device 1 is removed from the clamping portion 41a by the picker or the like. Since such insertion and removal are repeated, the socket 40a is required to have a predetermined strength. By providing the socket guide 42a with the recessed portion 421a and providing the clamping portion 41a inside the recessed portion 421a, the clamping portion 41a to which stress is applied by insertion and removal can be supported from an outer periphery by the socket guide 42a.

A plurality of terminals 50a (also referred to as pins) are formed in an array on a bottom portion 422a of the recessed portion 421a. The terminal 50a includes a metal material such as Cu. The terminal 50a penetrates the bottom portion 422a of the recessed portion 421a in an up-down direction and protrudes from both main surfaces of the bottom portion 422a. Here, a portion protruding from the upper surface of the bottom portion 422a is called an upper end portion 51a, and a portion penetrating the bottom portion 422a and protruding from the lower surface is called a lower end portion 52a.

A lower end portion 52a of the terminal 50a extends downward through the lower surface of the bottom portion 422a and is inserted into the through-hole 33 of the board 30a. As a result, the conductive layer 32a of the board 30a and the terminal 50a are electrically and thermally connected via the metal layer 34 of the through-hole 33.

The upper end portion 51a of the terminal 50a extends upward from the upper surface of the bottom portion 422a. The upper end portion 51a includes a plunger pin 53a and a coil spring (not shown). The plunger pin 53a protrudes upward from a tip of the upper end portion 51a and is capable of coming into contact with the terminal 14 of the semiconductor device 1 at the tip portion. The coil spring is connected to the plunger pin 53a on a side opposite to a side connected to the terminal 14. One end of the plunger pin 53a and the coil spring are built in an inside portion of the terminal 50a.

The plunger pin 53a is includes a metal material such as Cu, and is configured to be movable in the up-down direction by the compression and repulsive force of the coil spring. For example, when the semiconductor device 1 is mounted on the socket 40a, the plunger pin 53a can move downward while sliding along the terminal 50a while maintaining contact with the terminals 14. Therefore, for example, even if sizes of the terminals 14 in the up-down direction are individually different, the plunger pin 53*a* moves in the up-down direction in accordance with the size of the terminal 14, and thereby electrical and thermal connection between the terminal 50*a* and the terminal 14 of the semiconductor device 1 is maintained more reliably.

The heat conductive material 60*a* has a configuration in which a predetermined amount of filler that includes metal-containing particles is added to macromolecular gel. The macromolecular gel contains, for example, a macromolecular polymer having electrical insulation properties, is solid-like with flexibility, and has a certain degree of conformability to uneven portions. Specifically, for example, the macromolecular gel is formed by adding a solvent to the macromolecular polymer having a three-dimensional network structure and swelling the macromolecular polymer. Examples of the macromolecular polymer include phenol resin, and examples of the solvent include those having insulating properties, such as organic solvents and pure water.

The macromolecular gel has a thermal conductivity of, for example, 1.0 [W/(m·K)] or more. In addition, the macromolecular gel has, for example, a heat resistance greater than 115° C. This is to prevent deterioration, scorching, or the like due to heat.

The filler contains particles or the like having electrical insulation and thermal conductivity. The filler has a thermal conductivity of 10 [W/(m·K)] or more. Examples of the filler include alumina (36 [W/(m·K)]) and aluminum nitride (319 [W/(m·K)]). In addition to the above, magnesia (48.4 [W/(m·K)]), silicon carbide (270 [W/(m·K)]), beryllia (272 [W/(m·K)]), silicon oxide, or the like may also be used. Any of these may be selected from the viewpoint of procurability and workability. The values in parentheses indicate the thermal conductivity at a temperature of 300 K.

The heat conductive material 60*a* having the above configuration has a high thermal conductivity of, for example, 10 [W/(m·K)] or more. In addition, the heat conductive material 60*a* has fluidity, and has, for example, a high filling property in a minute space such as between the terminals 14 on the lower surface of the semiconductor device 1. In addition, the heat conductive material 60*a* provides electrical insulation. The heat conductive material 60*a* is formed from the upper surface of the bottom portion 422*a* of the recessed portion 421*a* to a height of the step 411 of the clamping portion 41*a*.

With the above configuration, heat conducted from the heat conductive material 60*a* of each socket 40*a* to the terminal 50*a* is conducted in a planar direction of the board 30*a* via the conductive layer 32*a*. Thus, the board 30*a* functions as a cooling plate that receives the heat generated by the semiconductor device 1 held in each socket 40*a* and dissipates the heat in the planar direction.

Figures 3, 4:
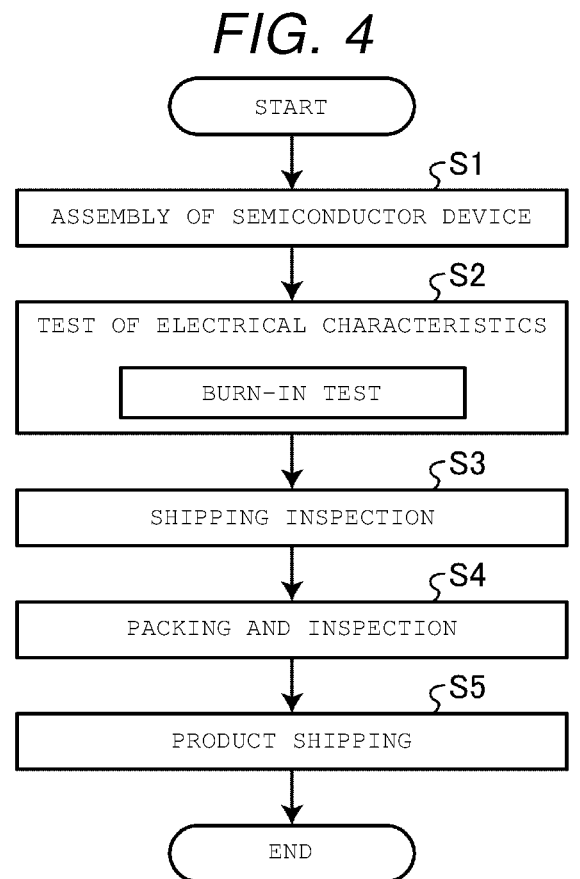
FIG. 3 is a view showing an example of a state where the semiconductor device is mounted on the socket board according to the first embodiment.
FIG. 4 is a flow chart showing a procedure of a method for inspecting the semiconductor device according to the first embodiment.

FIG. 3 shows a state where the semiconductor device 1 is mounted on the above-described socket board 100. FIG. 3 is a view showing an example of a state where the semiconductor device 1 is mounted on the socket board 100 according to Embodiment 1.

As shown in FIG. 3, the lower end portion 52*a* of the terminal 50*a* is inserted into the through-hole 33 of the board 30*a*. Therefore, the board 30*a* and the terminal 50*a* are electrically and thermally connected. In addition, the heat conductive material 60*a* is disposed on the upper surface of the bottom portion 422*a* of the recessed portion 421*a*. The semiconductor device 1 is mounted on the socket 40*a* in a state where the surface of the semiconductor device 1 having the terminals 14 faces downward.

At this time, the terminal 14 of the semiconductor device 1 comes into contact with the plunger pin 53*a* of the upper end portion 51*a* of the terminal 50*a*. In addition, the heat conductive material 60*a* disposed on the upper surface of the bottom portion 422*a* of the recessed portion 421*a* is filled between the terminals 14 on the lower surface of the semiconductor device 1 to wrap each terminal 14. As a result, the semiconductor device 1 and the board 30*a* are electrically and thermally connected via the terminals 50*a*.

Here, when power is supplied from the board 30*a* to the semiconductor device 1 mounted on the socket 40*a*, the semiconductor device 1 performs a predetermined operation, which may generate heat. Some of the generated heat is conducted from the terminals 14 on the lower surface of the semiconductor device 1 to the board 30*a* via the terminals 50*a*. Some of the heat is conducted from the lower surface of the semiconductor device 1 and the terminal 14 to the heat conductive material 60*a*, to the terminal 50*a*, and to the board 30*a*. This is because the lower surface of the semiconductor device 1, the terminals 14, and the periphery of the upper end portion 51*a* of the terminal 50*a* are filled with the heat conductive material 60*a* having high thermal conductivity without gaps.

Next, a method for inspecting the semiconductor device 1 including a test process using the socket board 100 configured as described above will be described.

Method for Inspecting Semiconductor Device

FIG. 4 is a flow chart showing steps of the method for inspecting the semiconductor device 1 according to Embodiment 1. First, the semiconductor device 1 to be tested is assembled (step S1). As described above with reference to FIG. 1, the semiconductor device 1 may be assembled by, for example, the MCP method.

Various tests of electrical characteristics including a burn-in test are performed for the semiconductor device 1 mounted on the socket board 100 (step S2). For example, the described-above socket board 100 is used for the burn-in test.

Here, as a specific mounting method of the semiconductor device 1 on the socket 40*a*, the assembled semiconductor device 1 is picked up by a picker or the like. In a state where the surface of the semiconductor device 1 having the terminals 14 faces downward, the semiconductor device 1 is inserted into the clamping portion 41*a* of the socket 40*a* and is pressed from above by the latch 412. As a result, the semiconductor device 1 is mounted on the socket board 100, and the space between the upper surface of the bottom portion 422*a* of the socket 40*a* and the lower surface of the semiconductor device 1 is filled with the heat conductive material 60*a*.

At this time, it is assumed that the socket 40*a* suitable for the semiconductor device 1 to be tested is mounted on the board 30*a* in advance before the semiconductor device 1 is mounted on the socket 40*a*. This is because the shape and size are different depending on the type of semiconductor device 1. By inserting and removing the terminal 50*a* formed on the bottom portion 422*a* of the socket 40*a* into and from the through-hole 33 of the board 30*a*, the socket 40*a* can be easily attached and detached to and from the board 30*a*.

Further, at this time, it is assumed that the heat conductive material 60*a* is disposed in advance on the upper surface of the bottom portion 422*a* of the socket 40*a* before the semiconductor device 1 is mounted on the socket 40*a*. The heat conductive material 60*a* may be exchanged at any timing, such as the number of test times and a total test time.

Since having solid-like properties, the heat conductive material 60a can be easily exchanged.

Here, the upper surface of the semiconductor device 1 mounted on the socket board 100 is not covered by any member other than the portion pressed by the latch 412, and is exposed to the air.

Next, the socket board 100 is placed in a constant temperature chamber (not shown) heated to a predetermined set temperature. An interior of the constant temperature chamber is filled with air and is configured such that a plurality of socket boards 100 can be disposed in parallel with each other at predetermined intervals. The set temperature, that is, the temperature inside the chamber is set, for example, at 115° C.

In a state where the socket board 100 is accommodated in the constant temperature chamber, power is supplied from the test device (not shown) to the socket board 100 to operate the semiconductor device 1 for a predetermined period of time. This makes it possible to obtain the electrical characteristics of the semiconductor device 1, for example, under an environment of 115° C.

As a result of the test of the electrical characteristics as described above, the semiconductor device 1 that satisfies predetermined criteria is determined as a non-defective product.

In the above description, it is assumed that the temperature of the constant temperature chamber is raised to the predetermined set temperature before the socket board 100 is inserted, but the timing of the temperature rise is not limited. For example, the temperature may be raised after the socket board 100 is inserted.

In the process of step S2, shipping inspection is performed for the semiconductor device 1 that has passed the test of the electrical characteristics at high temperature (step S3).

In the shipping inspection, an appearance of the semiconductor device 1 is inspected. As a result of the inspection, the semiconductor device 1 that satisfies predetermined criteria is determined as a non-defective product.

In the process of step S3, packing and packing inspection are performed for the semiconductor device 1 that has passed the appearance inspection (step S4).

As a result of the inspection, the semiconductor device 1 that satisfies predetermined criteria is determined as a non-defective product.

The semiconductor device 1 that has passed all the processes up to step S4 is shipped (step S5).

Through the above processes, the semiconductor device 1 of Embodiment 1 is inspected.

COMPARATIVE EXAMPLE

Figure 5:
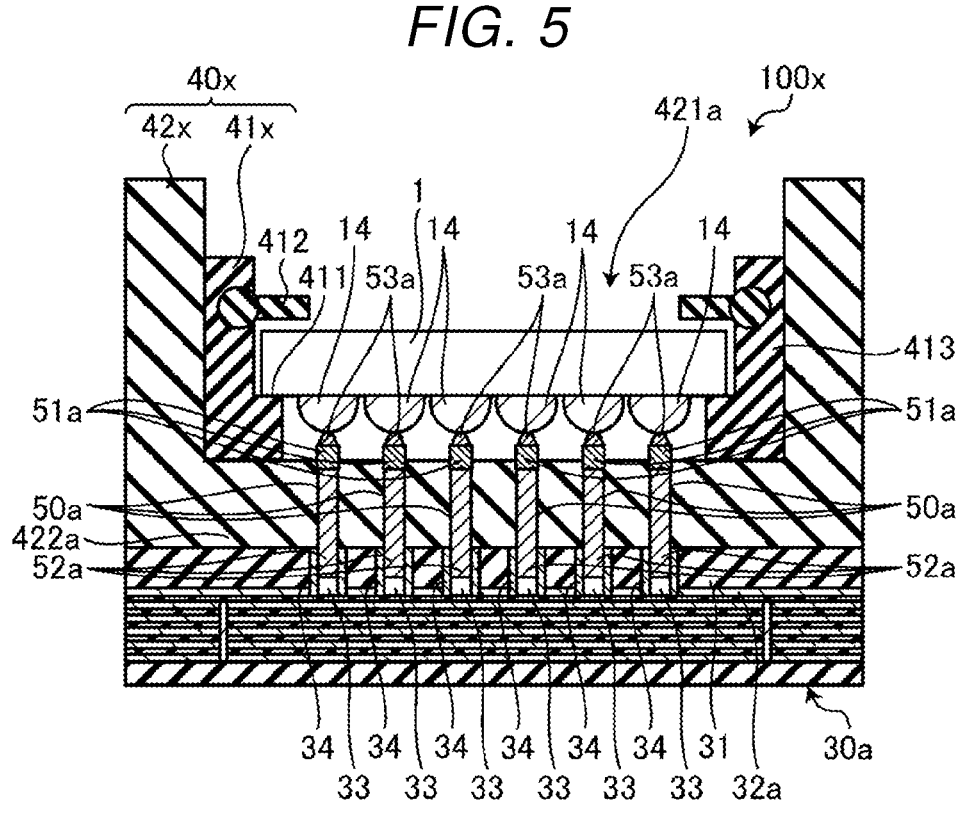
FIG. 5 is a view showing an example of a state where a semiconductor device is mounted on a socket board according to a comparative example.

Next, a socket board 100x of a comparative example will be described with reference to FIG. 5. FIG. 5 is a view showing an example of a state where the semiconductor device 1 is mounted on the socket board 100x according to the comparative example.

As shown in FIG. 5, in the socket board 100x of the comparative example, there is a gap between an upper surface of a bottom portion 422a of a socket 40x and a lower surface of the semiconductor device 1, and the gap is filled with air.

Such a socket board 100x is placed in a constant temperature chamber set at, for example, 115° C., power is supplied, and the semiconductor device 1 is operated for a predetermined period of time. Then, a temperature inside the socket 40x holding the semiconductor device 1 may rise to, for example, about 135° C. This is because the upper and lower surfaces of the semiconductor device 1 are covered with air having a low thermal conductivity (0.0316 [W/(m·K)] at 100° C.), and the heat generated by operating the semiconductor device 1 for a predetermined period of time is not dissipated and accumulates within the socket 40a.

In such a case, in the socket board 100x of the comparative example, the accuracy of the test of the electrical characteristics may deteriorate. This is because the semiconductor device 1 is heated to 135° C. by the heat accumulated within the socket 40a, and as a result, the semiconductor device 1 is operated under a temperature environment that is 20° C. higher than the set temperature of 115° C. If the test is performed in such an excessive environment, the electrical characteristics of the semiconductor device 1 are more likely to fail to meet the predetermined standards, and accurate test results may not be obtained due to decreased yield or the like.

According to the socket board 100 of Embodiment 1, the heat conductive material 60a, which is obtained by adding the filler to the macromolecular gel, is disposed on the upper surface of the bottom portion 422a of the socket 40a that holds the semiconductor device 1.

As a result, the entire terminals 14 on the lower surface of the semiconductor device 1 are covered with the heat conductive material 60a substantially without gaps. Then, the heat generated by the operation of the semiconductor device 1 is dissipated to the board 30a via the terminals 50a of the socket 40a, and is also dissipated from the heat conductive material 60a to the board 30a via the terminals 50a. Since the heat generated by the operation of the semiconductor device 1 is prevented from being accumulated in the socket 40a in this manner, the test of the semiconductor device 1 can be performed under a desired temperature environment. This makes it possible to improve the test accuracy of the semiconductor device 1.

Modified Example 1

Figure 6:
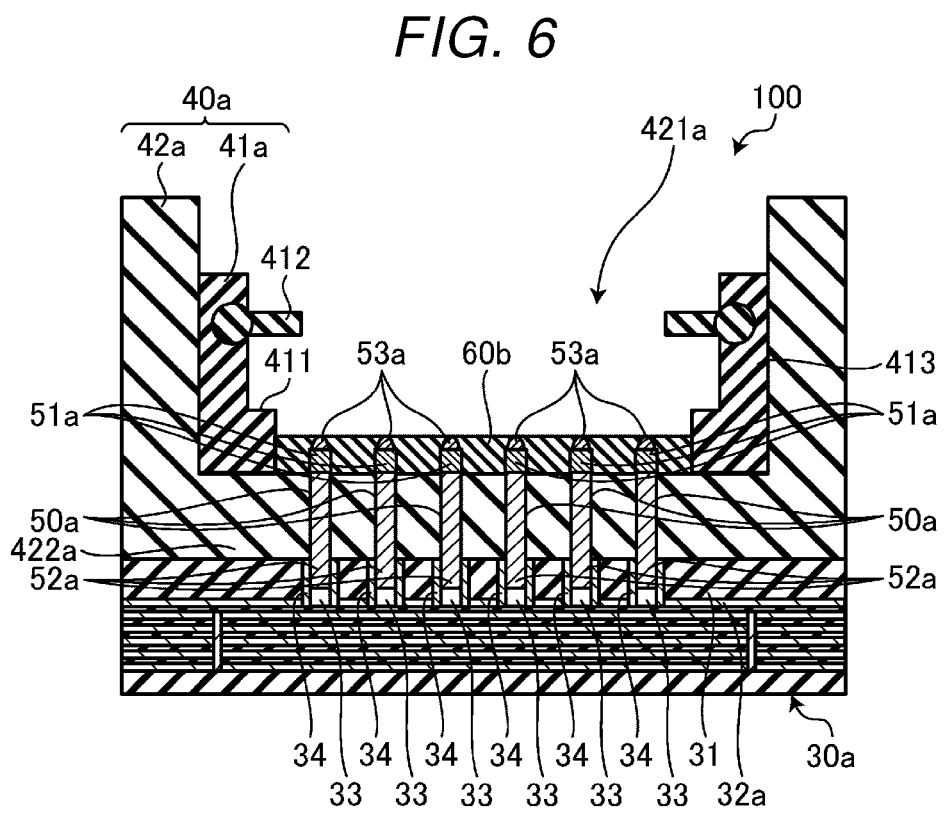
FIG. 6 is a view showing an example of a configuration of a socket board according to a first modified example of the first embodiment.

A socket board according to Modified Example 1 of Embodiment 1 will be described with reference to FIG. 6. FIG. 6 is a view showing an example of a configuration of a socket board according to Modified Example 1 of Embodiment 1. The socket board of Modified Example 1 differs from Embodiment 1 in that the heat conductive material 60b used is reduced.

As shown in FIG. 6, in the socket board of Modified Example 1, the heat conductive material 60b is formed from the upper surface of the bottom portion 422a of the recessed portion 421a to the height of the tip portion of the plunger pin 53a. As a result, for example, when the semiconductor device 1 is mounted on the socket 40a, the lower end portion of the terminal 14 on the lower surface of the semiconductor device 1 comes into contact with the heat conductive material 60b.

As a result, a possibility that the heat conductive material 60b enters between the terminal 14 of the semiconductor device 1 and the tip portion of the plunger pin 53a is reduced, so that the semiconductor device 1 and the terminal 50a are electrically and thermally connected more reliably. As a result, a desired operation of the semiconductor device 1 can be performed more reliably, and the heat generated by the operation of the semiconductor device 1 can be dissipated more reliably to the board 30a via the terminal 50a.

According to the socket board and the method for inspecting the semiconductor device of Modified Example 1, other effects similar to those of the socket board 100 and the method for inspecting the semiconductor device 1 of above-described Embodiment 1 are obtained.

Modified Example 2

Figure 7:
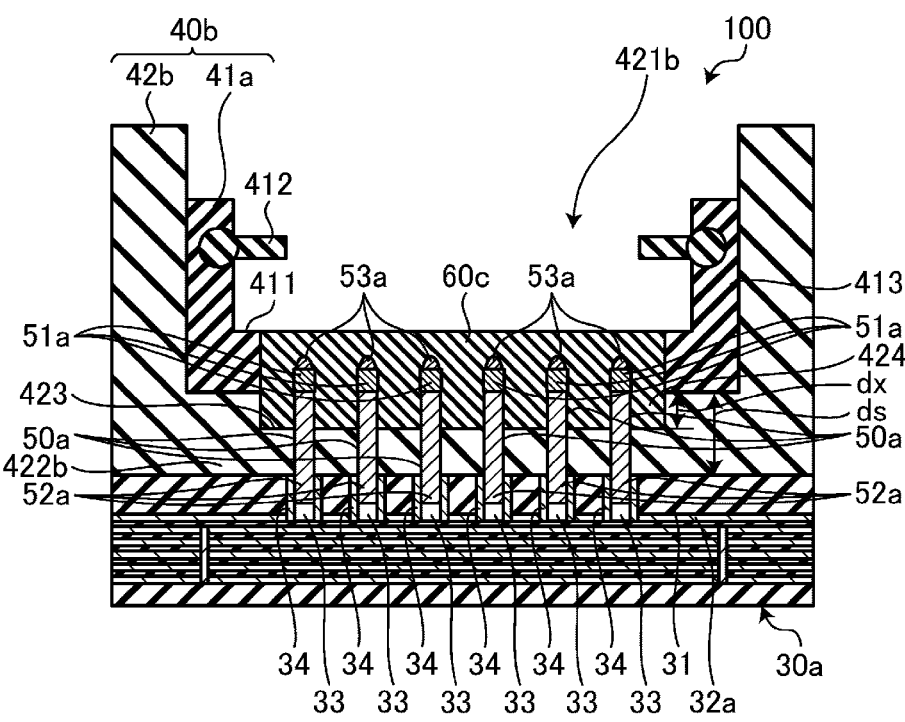
FIG. 7 is a view showing an example of a configuration of a socket board according to a second modified example of the first embodiment.

A socket board according to Modified Example 2 of Embodiment 1 will be described with reference to FIG. 7. FIG. 7 is a view showing an example of a configuration of a socket board according to Modified Example 2 of Embodiment 1. The socket board of Modified Example 2 includes a socket guide 42b having a shape different from that of above-described Embodiment 1.

As shown in FIG. 7, a bottom portion 422b of the recessed portion 421b of the socket guide 42b extends downward by a depth dx. Therefore, a recess 424 having a bottom portion 423 is provided inside the recessed portion 421b.

A heat conductive material 60c is formed from the bottom portion 423 configured in this way to the height of the step 411 of the clamping portion 41a. That is, the socket board according to Modified Example 2 has a configuration in which a portion of the upper surface side of the bottom portion 422b of the socket guide 42b is replaced with the heat conductive material 60c. As a result, the terminals 50a can be covered with the heat conductive material 60c over a wider range, so that the heat generated by the operation of the semiconductor device 1 can be efficiently dissipated from the heat conductive material 60c to the board 30a via the terminals 50a.

The depth dx of the recess 424 is preferably 25% or less of a width ds of the bottom portion 422b of the recessed portion 421b. Therefore, if the width ds of the bottom portion 422b is, for example, 8.2 mm, the strength of the socket 40b is sufficiently maintained.

According to the socket board and the method for inspecting the semiconductor device of Modified Example 2, other effects similar to those of the socket board 100 and the method for inspecting the semiconductor device 1 of above-described Embodiment 1 are obtained.

Modified Example 3

Figure 8:
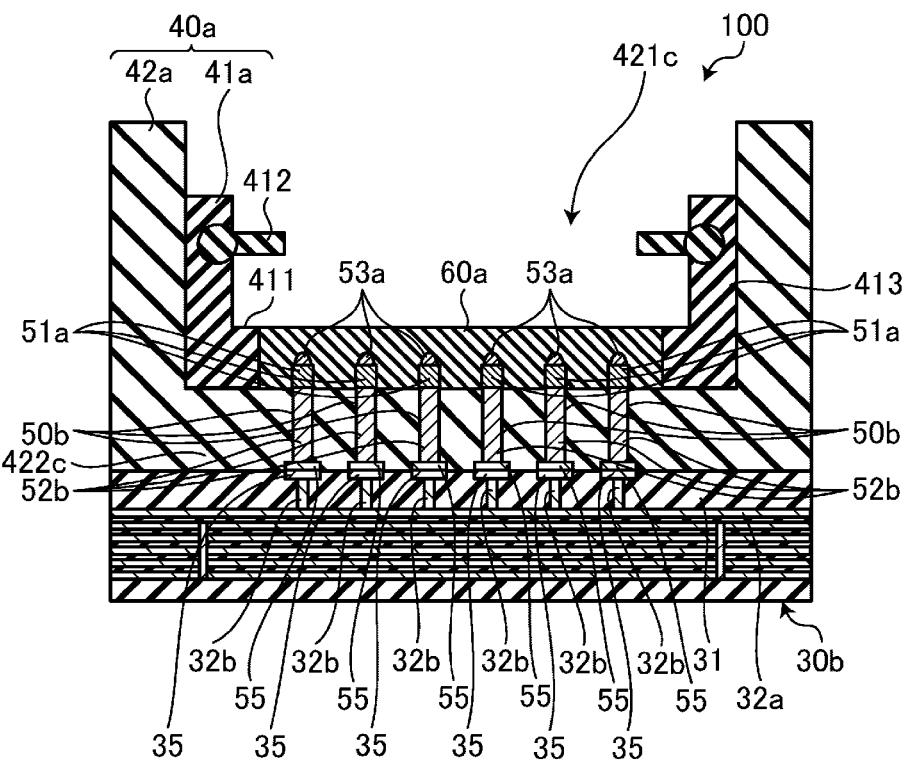
FIG. 8 is a view showing an example of a configuration of a socket board according to a third modified example of the first embodiment.

A socket board according to Modified Example 3 of Embodiment 1 will be described with reference to FIG. 8. FIG. 8 is a view showing an example of a configuration of the socket board according to Modified Example 3 of Embodiment 1. In the socket board of Modified Example 3, the method for connecting the board 30b and the terminals 50b is different from that of Embodiment 1.

As shown in FIG. 8, in the socket board of Modified Example 3, electrode pads 35 and vias 32b are formed in the board 30b instead of the through-hole 33. The electrode pads 35 are provided on the upper surface of the board 30b and are connected to the conductive layer 32a via the vias 32b or the like extending vertically between the electrode pads 35 and the conductive layer 32a. Electrode pads 55 are provided on the lower surface of the bottom portion 422c of the recessed portion 421c. The electrode pads 55 are connected to the lower end portions 52b of the terminals 50b formed on the bottom portion 422c on the lower surface of the bottom portion 422c.

The electrode pads 35 and the electrode pads 55 having such a configuration are disposed so as to overlap one another and are joined by soldering or the like, so that the conductive layer 32a of the board 30a and the terminal 50b are electrically and thermally connected.

According to the socket board and the method for inspecting the semiconductor device of Modified Example 3, effects similar to those of the socket board 100 and the method for inspecting the semiconductor device 1 of above-described Embodiment 1 are obtained.

Modified Example 4

Figure 9:
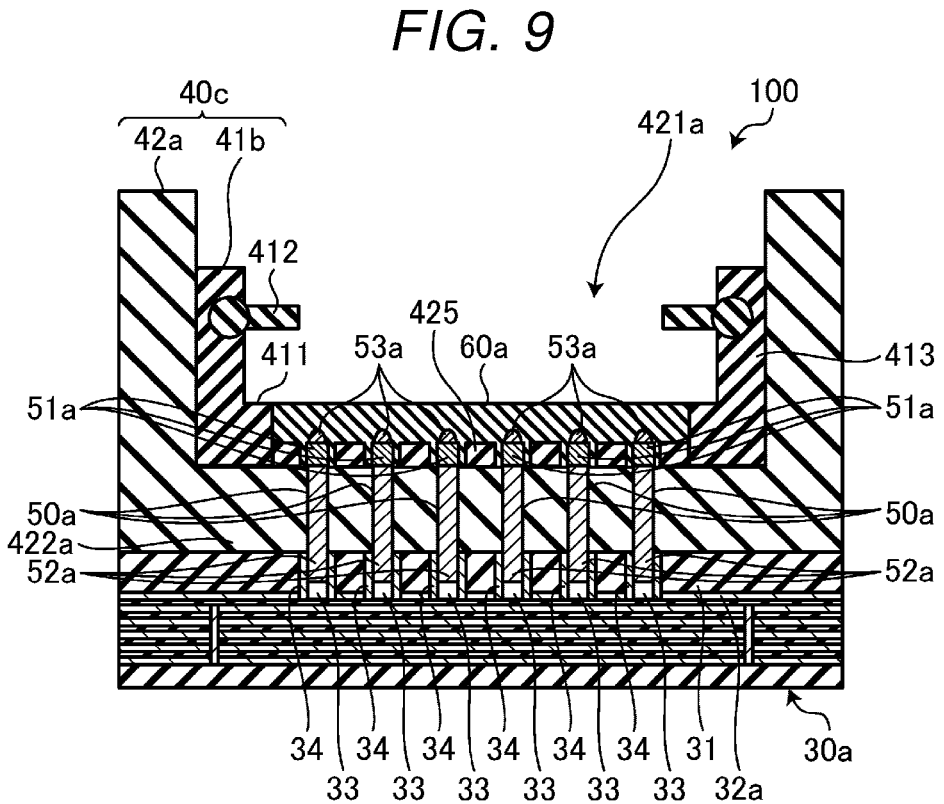
FIG. 9 is a view showing an example of a configuration of a socket board according to a fourth modified example of the first embodiment.

A socket board of Modified Example 4 of Embodiment 1 will be described with reference to FIG. 9. FIG. 9 is a view showing an example of a configuration of a socket board according to Modified Example 4 of Embodiment 1. The socket board of Modified Example 4 is different from that of the above-described Embodiment 1 in that a guide 425 is provided in the socket guide 42a.

As shown in FIG. 9, in the socket board of Modified Example 4, the clamping portion 41b of the socket 40c has the guide 425 formed along the bottom portion 422a of the recessed portion 421a of the socket guide 42a.

The guide 425 is made of, for example, the same material as the clamping portion 41b, such as resin. The guide 425 protrudes from the upper surface of the bottom portion 422a of the recessed portion 421a and is formed in a grid shape by partitioning the terminals 50a arranged in an array. Thus, for example, when the semiconductor device 1 is mounted on the socket 40c, the terminals 14 connected to the terminals 50a of the socket 40c on the lower surface of the semiconductor device 1 are supported from the periphery by the guides 425. As a result, the mounting stability of the semiconductor device 1 on the socket 40c is further enhanced.

According to the socket board and the method for inspecting the semiconductor device of Modified Example 4, other effects similar to those of the socket board 100 and the method for inspecting the semiconductor device 1 of above-described Embodiment 1 are obtained.

Although the socket guides 42a and 42b are not provided with the guides 425 in described-above Embodiment 1 and Modified Examples 1 to 3, the configuration is not limited to this. For example, the guides 425 may be formed in the socket guides 42a and 42b.

Embodiment 2

Hereinafter, a socket board 200 of Embodiment 2 will be described in detail with reference to FIGS. 10A and 10B to FIGS. 13A and 13B. The socket board 200 of Embodiment 2 includes terminals 50c having a shape different from that of described-above Embodiment 1. In addition, below, the same symbol is assigned to the same configuration as that in described-above Embodiment 1, and the description may be omitted.

Configuration Example of Socket Board

Figure 10A:
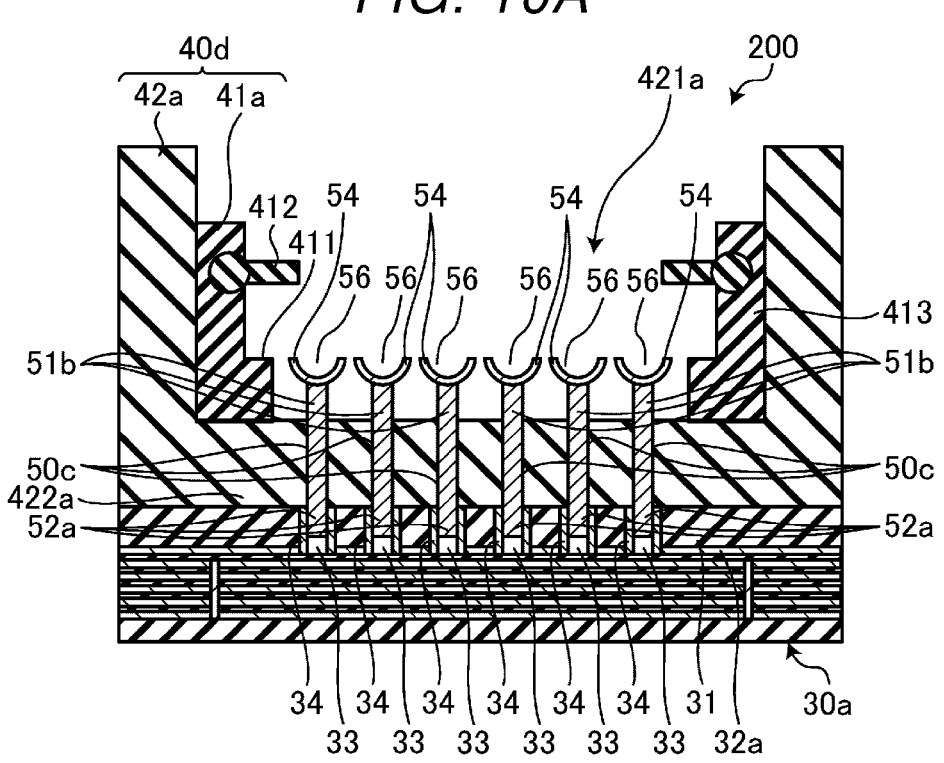
FIGS. 10A and 10B are views showing an example of a configuration of a socket board according to a second embodiment.
Figure 10B:
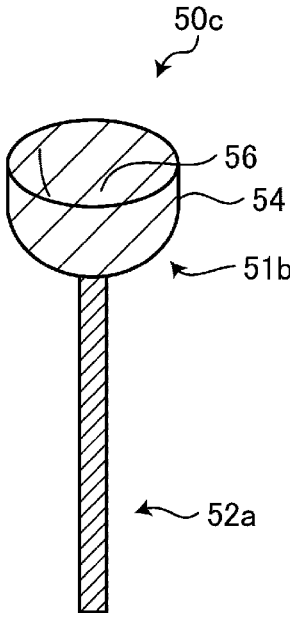

FIGS. 10A and 10B are views showing an example of a configuration of the socket board 200 according to Embodiment 2. FIG. 10A is a sectional view of the socket board 200 according to Embodiment 2 and FIG. 10B is a perspective view of a terminal 50c provided in the socket board 200.

As shown in FIG. 10A, a socket 40d provided in the socket board 200 of Embodiment 2 includes a clamping portion 41a, a socket guide 42a, and terminals 50c as pins. The terminal 50c penetrates the bottom portion 422a of the recessed portion 421a in the up-down direction and protrudes from both main surfaces of the bottom portion 422a. An upper end portion 51b of the terminal 50c extending upward from the upper surface of the bottom portion 422a includes a curved pin 54 at its tip portion which can come into contact with the terminal 14 as a ball-shaped terminal formed on the lower surface of the semiconductor device 1. The curved pin 54 is made of, for example, the same metal material as the terminal 50c.

As shown in FIG. 10B, the curved pin 54 of the terminal 50c includes a concave portion 56. The concave portion 56 is configured to have a bowl-like curved surface along a spherical surface of the terminal 14 of the semiconductor device 1. For example, when the semiconductor device 1 is mounted on the socket 40d, the lower end portions (lower hemispheres) of the terminals 14 on the lower surface of the semiconductor device 1 are individually covered with the concave portions 56. In this manner, the terminals 14 and the concave portions 56 are electrically and thermally connected on their respective surfaces.

With the above configuration, the heat generated by the operation of the semiconductor device 1 is conducted from the surface of the terminal 14 to the surface of the concave portion 56 and dissipated to the board 30a via the terminal 50c.

Method for Inspecting Semiconductor Device

Next, a method for inspecting the semiconductor device 1 including a test process using the socket board 200 configured as described above will be described.

In the inspecting process of the semiconductor device 1 as well, prior to conducting various tests of the electrical characteristics including the burn-in test, the processing of step S1 in FIG. 3 of described-above Embodiment 1, that is, assembling of the semiconductor device 1 is performed.

The assembled semiconductor device 1 is mounted on the socket 40d of the socket board 200, and the socket board 200 is placed in a constant temperature chamber (not shown) heated to a predetermined set temperature. It is assumed that the set temperature, that is, the temperature inside the chamber is set, for example, at 115° C.

In a state where the socket board 200 is accommodated in the constant temperature bath, power is supplied from a test device (not shown) to the socket board 200 to operate the semiconductor device 1 for a predetermined period of time.

At this time, the heat generated by the operation of the semiconductor device 1 is dissipated from the curved pins 54 covering the terminals 14 on the lower surface of the semiconductor device 1 to the board 30a via the terminals 50c. As a result, since heat is prevented from being accumulated in the socket 40d, the test of the electrical characteristics of the semiconductor device 1 can be performed under a desired temperature environment.

As a result of the test of the electrical characteristics described above, for the semiconductor device 1 that satisfies a predetermined standard, the processing after step S3 in FIG. 3 is performed. Then, the semiconductor device 1 that has passed all the steps after step S3 in FIG. 3 is shipped.

As described above, the semiconductor device 1 of Embodiment 2 is inspected.

According to the socket board 200 and the method for inspecting the semiconductor device 1 of Embodiment 2, effects similar to those of the socket board 100 and the method for inspecting the semiconductor device 1 of above-described Embodiment 1 are obtained.

Modified Example 1

Figure 11:
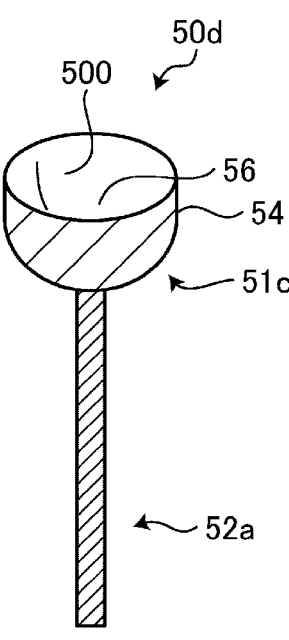
FIG. 11 is a view showing an example of a configuration of a terminal provided on a socket board according to a first modified example of the second embodiment.

A socket board according to Modified Example 1 of Embodiment 2 will be described with reference to FIG. 11. FIG. 11 is a view showing an example of a configuration of a terminal 50d provided in the socket board according to Modified Example 1 of Embodiment 2. The socket board of Modified Example 1 differs from above-described Embodiment 2 in that the concave portion 56 of the terminal 50d is provided with a filler 500.

As shown in FIG. 11, the filler 500 is disposed on the surface of the concave portion 56 of the curved pin 54 provided in the terminal 50d of the socket board of Modified Example 1. The filler 500 is, for example, a heat conductive material (more generally a thermal interface material) or the like used to improve thermal conductivity between members, and is made of a paste-like resin or the like. The filler 500 has a thermal conductivity of, for example, 1.0 [W/(m·K)] or more.

A plurality of terminals 14 provided on the lower surface of the semiconductor device 1 have substantially the same shape and size. In addition, the shape of the concave portion 56 of the curved pin 54 is designed to fit such a terminal 14. However, there may be slight differences in curvature, size, and the like among the plurality of terminals 14, and a gap may occur between the terminal 14 on the lower surface of the semiconductor device 1 and the concave portion 56 of the curved pin 54. For example, when the semiconductor device 1 is mounted on the socket board of Modified Example 1, the filler 500 is disposed between the terminal 14 on the lower surface of the semiconductor device 1 and the concave portion 56 of the curved pin 54. As a result, even if there is a gap between the surface of the terminal 14 and the concave portion 56, the terminal 14 and the curved pin 54 are in close contact with each other via the filler 500. As a result, the heat generated by the operation of the semiconductor device 1 is more efficiently conducted from the surface of the terminal 14 to the terminal 50d.

According to the socket board and the method for inspecting the semiconductor device 1 of Modified Example 1, other effects similar to those of the socket board 100 and the method for inspecting the semiconductor device 1 of above-described Embodiment 1 are obtained.

Modified Example 2

Figure 12:
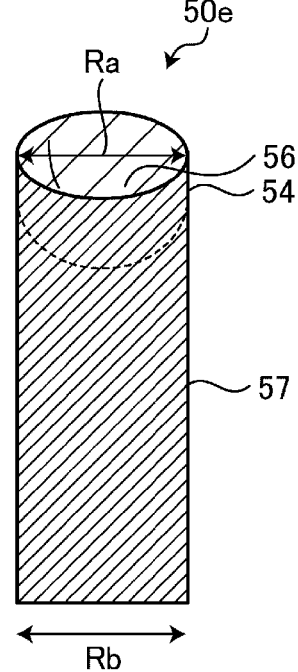
FIG. 12 is a view showing an example of a configuration of a terminal provided on a socket board according to a second modified example of the second embodiment.

A socket board according to Modified Example 2 of Embodiment 2 will be described with reference to FIG. 12. FIG. 12 is a view showing an example of a configuration of a terminal 50e provided in the socket board according to Modified Example 2 of Embodiment 2. In the socket board of Modified Example 2, a diameter of the terminal 50e is different from that of Embodiment 2.

As shown in FIG. 12, the terminal 50e of the socket board of Modified Example 2 includes a curved pin 54 at the upper end portion, and a body portion 57 penetrating the bottom surface of the socket in the up-down direction.

A width Rb of the body portion 57 is substantially the same as a width Ra of the curved pin 54, and the curved pin 54 and the body portion 57 are configured to overlap when viewed from above. That is, the upper surface of the body portion 57 covers the entire lower surface of the curved pin 54 that is recessed downward.

For example, when the semiconductor device 1 is mounted on the socket board of Modified Example 2, the heat generated by the operation of the semiconductor device 1 is conducted from the surface of the terminal 14 to the surface of the concave portion 56 of the curved pin 54, and furthermore, conducted to the body portion 57 via the entire lower surface of the curved pin 54. Thus, by increasing the width Rb of the body portion 57, that is, a volume of the entire terminal 50e serving as a heat conduction path, the heat generated by the operation of the semiconductor device 1 is more efficiently conducted to the terminal 50e.

As in FIG. 11, the filler 500 may be disposed in the concave portion 56 of the terminal 50*e*.

According to the socket board and the method for inspecting the semiconductor device 1 of Modified Example 2, other effects similar to those of the socket board 100 and the method for inspecting the semiconductor device 1 of above-described Embodiment 1 are obtained.

Modified Example 3

A socket board according to Modified Example 3 of Embodiment 2 will be described with reference to FIGS. 13A and 13B. The socket board of Modified Example 3 differs from that of described-above Modified Example 2 in that the concave portion 56 of the curved pin 54 has a plunger pin 53*b*.

Figure 13A:
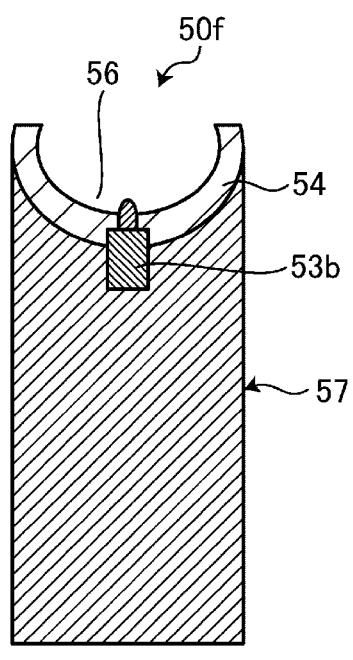
FIGS. 13A and 13B are views showing an example of a configuration of a terminal provided on a socket board according to a third modified example of the second embodiment.
Figure 13B:
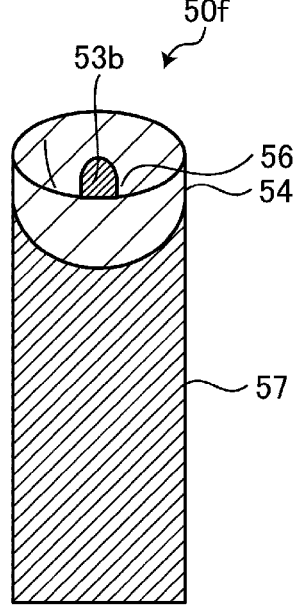

FIGS. 13A and 13B are views showing an example of a configuration of a terminal 50*f* provided in the socket board according to Modified Example 3 of Embodiment 2. FIG. 13A is a sectional view of the terminal 50*f* and FIG. 13B is a perspective view of the terminal 50*f*.

As shown in FIG. 13A, the terminal 50*f* of the socket board of Modified Example 3 includes the plunger pin 53*b* of which an upper end can come into contact with the terminal 14 of the semiconductor device 1 and a coil spring (not shown) connected to a lower end of the plunger pin 53*b* on a side opposite to a side connected to the terminal 14.

The lower end of the plunger pin 53*b* and the coil spring are built in the body portion 57 of the terminal 50*f*, and the upper end of the plunger pin 53*b* protrudes from the bottom surface of the concave portion 56 of the curved pin 54. For example, when the semiconductor device 1 is mounted on the socket board of Modified Example 3, the plunger pin 53*b* moves downward while sliding along the body portion 57 while maintaining contact with the terminals 14 on the lower surface of the semiconductor device 1. As a result, as described above, even if there is a gap between the terminal 14 on the lower surface of the semiconductor device 1 and the concave portion 56 of the curved pin 54, the terminal 50*f* and the semiconductor device 1 are electrically and thermally connected more reliably.

As in FIG. 11, the filler 500 may be disposed in the concave portion 56 of the terminal 50*f*.

According to the socket board and the method for inspecting the semiconductor device 1 of Modified Example 3, other effects similar to those of the socket board 100 and the method for inspecting the semiconductor device 1 of above-described Embodiment 1 are obtained.

In described-above Embodiments 1 and 2, and Modified Examples, the clamping portion 41*a* or 41*b* and the socket guide 42*a* or 42*b* are, for example, integrally molded and configured to be inseparable, but the configuration is not limited to this. The clamping portion 41*a* or 41*b* and the socket guide 42*a* or 42*b* may be separately molded and assembled after each molding.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A socket board used for testing a semiconductor device having one or more terminals, by raising a temperature of the semiconductor device to a predetermined temperature, comprising:
   a substrate;
   a socket that is provided on the substrate and capable of holding the semiconductor device;
   a pin that penetrates a bottom portion of the socket and has an upper portion that is to come into contact with a terminal of the semiconductor device; and
   a heat conductive material that is disposed on the bottom portion of the socket to come into contact with the terminals of the semiconductor device held in the socket,
   wherein the heat conductive material includes
   a macromolecular gel, and
   electrically-insulating metal-containing particles including at least one of alumina, aluminum nitride, magnesia, and beryllia, added to the macromolecular gel.

2. The socket board according to claim 1, wherein the terminals of the semiconductor device are buried in the heat conductive material when the semiconductor device is held in the socket.

3. The socket board according to claim 1, wherein an upper surface of the upper portion of the pin is at a substantially same level as an upper surface of the heat conductive material.

4. The socket board according to claim 1, wherein
   the socket has a concave portion formed in the bottom portion thereof, and
   the heat conductive material is filled in the concave portion.

5. The socket board according to claim 1, wherein the socket includes a recessed portion in which the semiconductor device is to be held.

6. The socket board according to claim 5, wherein the socket includes a guide on an inner surface of the recessed portion, the guide having a latch by which the semiconductor device held in the recessed portion is secured.

7. The socket board according to claim 6, wherein the guide extends along a bottom surface of the recessed portion and the upper portion of the pin extends through the guide.

8. The socket board according to claim 7, wherein the upper portion of the pin includes a plunger pin against which the terminal of the semiconductor device presses when the semiconductor device is secured in the recessed portion.

9. A method for inspecting a semiconductor device, comprising:
   mounting the semiconductor device on a socket of a socket board so that terminals of the semiconductor device are respectively supported by pins of the socket board that penetrate a bottom portion of the socket, and come into contact with a heat conductive material that is disposed on the bottom portion of the socket, wherein the heat conductive material includes a macromolecular gel and electrically-insulating metal-containing particles including at least one of alumina, aluminum nitride, magnesia, and beryllia, added to the macromolecular gel;
   supplying power to the semiconductor device via the pin while the socket board on which the semiconductor device is mounted is maintained at a constant temperature; and then
   performing an operation test on the semiconductor device.

10. The method according to claim 9, wherein the socket includes a recessed portion in which the semiconductor device is to be held.

11. The method according to claim 10, wherein said mounting includes the step of securing the semiconductor device in the recessed portion with a latch.

12. The method according to claim 11, wherein each of the pins includes a body portion that penetrates the bottom portion of the socket and a plunger pin at an upper end of the body portion against which a respective terminal of the semiconductor device presses when the semiconductor device is secured in the recessed portion.

13. The method according to claim 9, wherein the terminals of the semiconductor device are buried in the heat conductive material.

14. The method according to claim 9, wherein
each of the pins includes a body portion that penetrates the
bottom portion of the socket and a plunger pin that is
in contact with a respective terminal of the semicon-
ductor device and is at an upper end of the body portion
that is at a substantially same level as an upper surface
of the heat conductive material.

* * * * *